United States Patent
Doyle et al.

(10) Patent No.: US 6,656,822 B2
(45) Date of Patent: *Dec. 2, 2003

(54) METHOD FOR REDUCED CAPACITANCE INTERCONNECT SYSTEM USING GASEOUS IMPLANTS INTO THE ILD

(75) Inventors: Brian S. Doyle, Cupertino, CA (US); Brian Roberds, Santa Clara, CA (US); Sandy S. Lee, Palo Alto, CA (US); Quat Vu, Santa Clara, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/344,918

(22) Filed: Jun. 28, 1999

(65) Prior Publication Data
US 2002/0090791 A1 Jul. 11, 2002

(51) Int. Cl.[7] ...................... H01L 21/265; H01L 21/336
(52) U.S. Cl. ...................... 438/523; 438/301; 438/367; 438/530; 438/532
(58) Field of Search .................. 438/303, 305, 438/197, 517, 530, 532, 523, 364–367, 528, 969; 257/288, 418, 415, 417

(56) References Cited

U.S. PATENT DOCUMENTS

| | | | |
|---|---|---|---|
| 4,408,254 A | * 10/1983 | Chu et al. | ............ 361/121 |
| 4,671,852 A | 6/1987 | Pyke | |
| 4,706,378 A | * 11/1987 | Havemann | ........ 148/DIG. 10 |
| 5,075,242 A | 12/1991 | Nakahara | |
| 5,488,004 A | * 1/1996 | Yang | ............ 437/35 |
| 5,491,365 A | * 2/1996 | Chin et al. | ............ 257/751 |
| 5,508,215 A | * 4/1996 | Jeng | ............ 437/38 |
| 5,683,934 A | 11/1997 | Candelaria | |
| 5,892,269 A | * 4/1999 | Inoue et al. | ............ 257/634 |
| 5,924,001 A | 7/1999 | Yang et al. | |
| 5,955,767 A | 9/1999 | Liu et al. | |
| 5,986,301 A | * 11/1999 | Fukushima et al. | ...... 257/295 |
| 6,027,977 A | * 2/2000 | Mogami | ............ 438/287 |
| 6,046,098 A | 4/2000 | Iyer | |
| 6,057,189 A | * 5/2000 | Huang et al. | ............ 438/253 |
| 6,168,981 B1 | * 1/2001 | Battaglia et al. | ............ 438/164 |
| 6,228,694 B1 | * 5/2001 | Doyle et al. | ............ 438/199 |
| 6,281,532 B1 | * 8/2001 | Doyle et al. | ............ 257/288 |
| 6,362,082 B1 | * 3/2002 | Doyle et al. | ............ 438/301 |
| 6,372,596 B1 | * 4/2002 | Havemann | ............ 257/E29.02 |

FOREIGN PATENT DOCUMENTS

JP  2-12945 A  1/1990

OTHER PUBLICATIONS

Elfenthal, et al "Migration of High Energy Defects After Pd–Implantation in Oxide Films on Titanium", Ber. Bunsenges. Phys. Chem, vol. 91, pp. 432–437, 1987.*

G.A. Hishmeh, et al., "Rare gas bubbles in muscovite mica implanted with xenon and krypton," J. Mater, Res., vol. 9, No. 12, pp. 3095–3107 (Dec. 1994).

Reiji Yamada, Steven J. Zinkle, and G. Philip Pells, "Microstructure of Al2O3 and MgAl2O4 preimplanted with H, He, C and irradiated with Ar ions," Journal of Nuclear Materials, vol. 209, pp. 191–203 (1994).

E.D Sprecht, D.A. Walko, and S.J. Zinkle, "Density Reduction: A Mechanism for Amorphization at High Ion Doses," Mal. Res. Soc. Symp., vol. 316, pp. 241–246 (1994).

(List continued on next page.)

*Primary Examiner*—Michael S. Lebentritt
(74) *Attorney, Agent, or Firm*—Blakely, Sokoloff, Taylor & Zafman LLP

(57) ABSTRACT

A method of decreasing the dielectric constant of a dielectric layer. First, a dielectric layer is formed on a first conductive layer. A substance is then implanted into the dielectric layer.

21 Claims, 4 Drawing Sheets

OTHER PUBLICATIONS

V.Jeschke and G.H. Frischat, "Gas bubbles in glass melts under microgravity. Part 2 Helium diffusion," Physics and Chemistry of Glasses, vol. 28, No. 5, pp. 177–182 (Oct. 1987).

N. Moriya, Y. Shacham–Diamond, and R. Kalish, "Modification Effects in Ion–Implanted SiO2 Spin–on–Glass," J. Electrochem. Soc., vol. 140, No. 5, pp. 1442–1449 (May 1993).

R. Siegele, G.C. Weatherly, H.K. Haugen, D.J. Lockwood, and L.M. Howe, "Helium bubbles in silicon: Structure and optical properties," Appl. Phys. Lett. vol. 66, No. 11, pp. 1319–1321 (Mar. 13, 1995).

D.Bisero, F. Corni, C. Nobili, R. Tonini, G. Ottaviani, C. Mazzoleni and L. Pavesi, "Visible photoluminescence from He–implanted silicon," Appl. Phys. Lett., vol. 67, No. 23, pp. 3447–3449 (Dec. 4, 1995).

A. Van Veen, C.C. Greffioen, and J.H. Evans, "Helium–induced Porous Layer Formation in Silicon," Mat. Res. Soc. Symp. Proc., vol. 107, pp. 449–454 (1988).

V. Rineri, G. Fallica, and S. Libertino, "Lifetime control in silicon devices by voids induced by He ion implantation," J. Appl. Phys., vol. 79, No. 12, pp. 9012–9016 (Jun. 15, 1996).

D.M. Gollstaedt, S.M. Myers, S.R. Lee, J.L. Reno, R.L. Dawson, and J. Han, "Interaction of Cavities and Dislocations in Semiconductors," Mat. Res. Soc. Symp., vol. 438, pp. 229–234 (1997).

J.W. Medernach, T.A. Hill, S.M. Myers, and T.J. Headley, "Microstructural Properties of Hellium Implanted Void Layers in Silicon as Related to Front–Side Gettering," J. Electrochem. Soc., vol. 143, No. 2, pp. 725–735 (Feb. 1996).

D.M. Follstaedt, S.M. Myers, G.A. Petersen, and J.W. Medernach, "Cavity Formation and Impurity Gettering in He–Implanted Si," Journal of Electronic Materials, Special Issue Paper, vol. 25, No. 1, pp. 151–164 (1996).

D.M. Follstaedt, S.M. Myers, G.A. Petersen, and J.C. Barbour, "Cavity Nucleation and Evolution in He–Implanted Si and GaAs," Mat. Res. Soc. Symp., vol. 396, pp. 801–806 (1996).

V. Rineri and M. Saggio, "Radiation damage and implanted He atom interaction during void formation in silicon," App. Phys. Lett., vol. 71, No. 12, pp. 1673–1675 (Sep. 22, 1997).

Rare gas bubbles in muscovite mica implanted with xenon and kryton. j.Mater. Res., vol. 9, No. 12, Dec. 1994. pp. 3095–3107.

Microstructure of Al2O3 and MgAl2O4 preimplanted with H, He, C and irradiated with Ar+ oins*. Elsevier Science B.V. Journal of Nuclear Materials 209 (1994) pp. 191–203 No month.

Density Reproduction: A Mechanism for Amorphization at High Doses. E.D. Specht, D.A. Walko, and S.J. Zinkle. Mat. Res. Soc. Symp. Proc. vol. 316. 1994 Materials Research Society. pp. 241–246 No month.

Gas bubbles in glass melts under microgravity, Part 2, Helium diffusion. V. Jeschke and G.H. Frischat. Physics and Chemistry of Glasses vol. 28, No. 5, Oct. 1997. pp. 177–182.

Modification Effects in Ion–Implanted SiO2 Spin–on–Glass. N. Moriya, Y. Schacham–Diamond, R. Kalish. J. Electrochem. Soc. vol. 140, No. 5, May 1993. The Electrochemical Society, Inc. pp1442–1450.

Helium bubbles in silicon: Structure and optical properties. R. Siegele, G.C. Weatherly, H.K. Haugen, D.J. Lockwood, and L.M. Howe. American Institute of Physics. Appl. Phys. Lett. Mar. 13, 1995. pp 1319–3449.

Helium–Induced Porous Layer Formation in Silicon. A. Van Veen, C.C. Griffioien, and J.H. Evans. Material Research Society. Mat. Res. Soc. Symp. Proc. vol. 107. Mar. 1988, pp 449–454.

Lifetime control in silocon devices by voids induce by He ion implantation. V. Raineri, G. Fallica, and S. Libertino. J. Appl. Phys. 79 (12). Jun. 15, 1996. 1996 American institute of Physics. pp 9012–9016.

Interaction of Cavitiesand Dislocations in Semiconductors. D.M. Follstaedt, S.M. Myers, S.R. Lee, J.L. Reno, R.L. Dawson, and J. Han. Mat. Res. Soc. Symp. PRoc. vol. 438. 1997 Materials Research Society. pp 229–234 No month.

Microstructural Properties of Helium Implanted Void Layers in Silicon as Related to Front–Side Gettering. J.W. Medernach, T.A. Hill, S.M. Myers, and T.J. Headly. J. Electrochem. Soc., Sol. 143, No. 2. Feb. 1996. pp 725–735.

Cavity Formation and Imputirt Gettering in He–Implanted Si. D.M. Follstaedt, S.M. Meyers, G.A. Petersen, and J.W. Medernach. Journal of Electronic Materials, vol. 25, No. 1. 1996. pp151–156. No month.

Cavity and Nucleation and Evolution in He–Implanted Si and GaAs. D.M. Follstaedt, S.M. Myers, G.A. Petersen, and J.C. Barbour. Mat. Res.Soc. Symp., Proc. vol. 396. 1996 Materials Research Society. pp 801–806.

Radiation damage adn implanted He atom interaction during void formation. V. Raineri and. Saggio. Appl. Phys. Lett. 71 (12), Sep. 1997. pp1673–1675.

* cited by examiner

METHOD FOR REDUCED CAPACITANCE INTERCONNECT SYSTEM USING GASEOUS IMPLANTS INTO THE ILD

RELATED APPLICATIONS

Applications related to the present invention include: (1) application Ser. No. 09/340,583, filed Jun. 28,1999, entitled Method of Increasing the Mobility of MOS Transistors by Use of Localized Stress Regions, which issued as U.S. Pat. No. 6,228,694 on May 8, 2001; (2) application Ser. No. 09/340,954, filed Jun. 28, 1999, entitled Technique to Obtain Increased Channel Mobilities in NMOS Transistors by Gate Electrode Enqineering, which issued as U.S. Pat. No. 6,281,532 on Aug. 28, 2001; (3) application Ser. No. 09/342,030, filed Jun. 28, 1999, entitled Methodology for Control of Short Channel Effects in MOS Transistors, which issued as U.S. Pat. No. 6,362,082 on Mar. 26, 2002; (4) application Ser. No. 10/045,346, filed Nov. 9, 2001, entitled Methodology for Control of Short Channel Effects in MOS Transistors, which is a divisional of application Ser. No. 09/342,030. Each of the related applications listed above has been assigned to the assignee of the present invention.

BACKGROUND OF THE INVENTION

1. Field of the Invention

A method of decreasing the global dielectric constant of an inter-level dielectric is described. More particularly, the present invention relates to the use of implants into the inter-level dielectric to decrease the global dielectric constant.

2. Description of Related Art

Semiconductor wafers are fabricated using a substrate having stacked layers, generally a first metal layer, then an inter-level dielectric (ILD) layer, then a second metal layer, etc. FIG. 1 illustrates a side cross-sectional view of a portion of a wafer having a first metal layer 10 and a second metal layer 12 separated by an ILD layer 14.

A continuous need in the manufacturing of semiconductor wafers is the reduction of the interconnect capacitance of a wafer. The capacitance of a structure may be calculated using the formula $$C = \varepsilon \frac{A}{d},$$

wherein C is the capacitance of a structure, $\varepsilon$ is the dielectric constant of a material within the structure, A is the cross-sectional area of the structure, and d is the distance between the two electrodes. Thus, to achieve the goal of lowering the capacitance of a material as much as possible, the dielectric constant ($\varepsilon$) must also be lowered as much as possible.

Typically, the ILD layer is comprised of silicon oxide ($SiO_2$), which has a dielectric constant of 4. The lowest dielectric constant possible is 1, which is the dielectric constant associated with an air gap (or vacuum). By merely modifying the currently used ILD layer of silicon oxide, there is consequently little need to address the integration issues, such as etchability, adhesion, etc., that arise when a new and different ILD layer, such as one fabricated from a polymer material, is used. Thus, it would be desirable to modify the ILD layer such that silicon oxide could still be used as the primary material, but the modified ILD layer would have a smaller dielectric constant than the dielectric constant of 4 associated with silicon oxide.

SUMMARY OF THE INVENTION

A method of decreasing the dielectric constant of a dielectric layer is described. First, a dielectric layer is formed on a first conductive layer. A substance is then implanted into the dielectric layer.

BRIEF DESCRIPTION OF THE DRAWINGS

The invention is further described by way of example with reference to the accompanying drawings, wherein.

DETAILED DESCRIPTION

A method of using implants in an inter-level dielectric (ILD) layer is described. The implants lower the dielectric constant of the ILD and thus lower the capacitance associated with devices formed therefrom. In the following description, numerous specific details are set forth such as specific materials, process parameters, dimensions, etc. in order to provide a thorough understanding of the present invention. It will be obvious, however, to one skilled in the art that these specific details need not be employed to practice the present invention. In other instances, well-known materials or methods have not been described in detail in order to avoid unnecessarily obscuring the present invention.

The present invention relates to a method of forming voids (also referred to as cavities, holes, bubbles, etc.) in an ILD to decrease the dielectric constant ($\in$) associated with the given ILD. Because the dielectric constant ($\in$) associated with the voids is significantly lower than that associated with the original material of the ILD, the overall dielectric constant ($\in$) of the ILD having the implanted voids will be less than that of the original ILD without the voids. Because the capacitance of a device is directly proportional to the dielectric constant ($\in$) of the material of the device, the capacitance for a device fabricated from the wafer containing the modified ILD and having the decreased dielectric constant ($\in$) will also decrease.

The substance to be implanted into the ILD may be any one of or combination of several different gases, including but not limited to the noble gases and oxygen. Other possible species which react to form voids or gaseous regions may also be used. In one embodiment of the present invention, argon is the gaseous substance implanted into the substrate of the to-be-formed device. For illustrative purposes only, the following embodiments of the present invention will be discussed with use of argon-formed voids.

Figure 1:
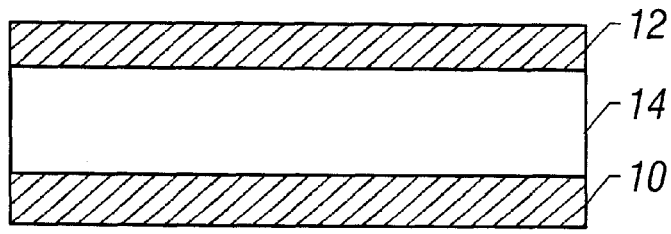
FIG. 1 is a side cross-sectional view of a portion of a wafer having two metal layers separated by an inter-level dielectric (ILD) layer.
Figure 2:
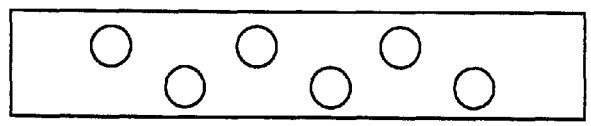
FIG. 2 is a side cross-sectional view of a substrate having gaseous implants therein.
Figure 3:
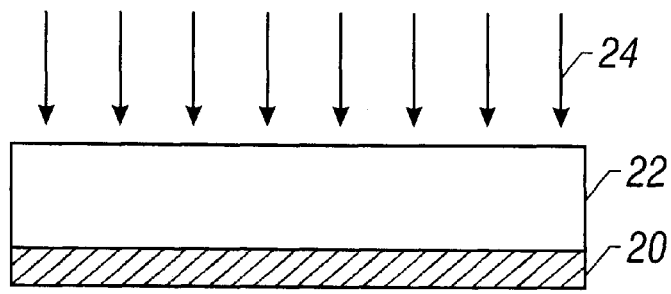
FIG. 3 is a side cross-sectional view of a dielectric layer during implantation of a gaseous substance.
Figure 4:
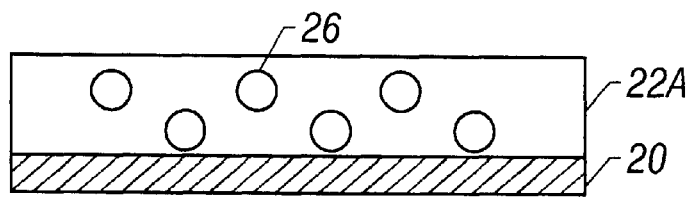
FIG. 4 is a side cross-sectional view of the voids formed in the dielectric layer after annealing.

The implantation of voids into a substrate is known and will not be discussed in detail herein. Thus, a conventional implanter may be used to implant the gaseous substance into the ILD. One embodiment of the present invention is illustrated in FIGS. 3 and 4. FIG. 3 is a side cross-sectional view of a first conductive layer (e.g., metal layer) 20 having an ILD layer 22 formed thereon. A gaseous implantation 24 is applied at an energy of approximately 135 keV (kilo electron volts) and a dosage of approximately $10^{16}$ to $10^{17}$ atoms/$cm^2$. In this embodiment, the depth of the implantation into the ILD layer (e.g., $SiO_2$) 22 is approximately 1500 Å. Note that the depth of the implantation is controlled by the energy of the implant and may be modified as required by the size of a given device.

As the gaseous substance 24 is introduced into the ILD 22, damage is caused by the gaseous substance 24 to the ILD 22. The damage may be comprised of displaced atoms, broken bonds, etc. As the ILD 22 is annealed at approximately 400–500° C. for approximately 30 seconds, the damage to the ILD 22 of FIG. 3 begins to anneal away and the formation of voids 26 in the resulting ILD 22A begins, as illustrated in FIG. 4.

Figure 5:
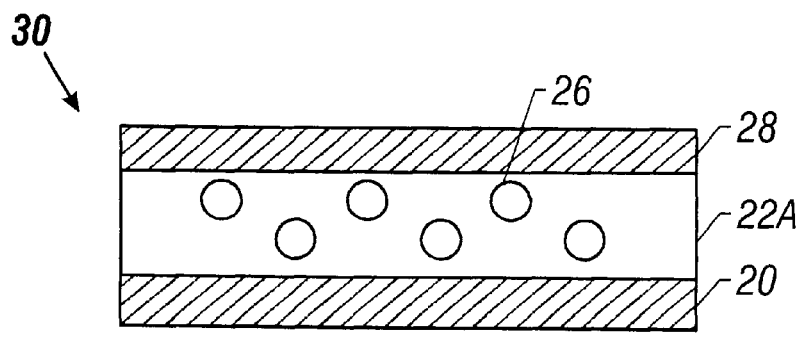
FIG. 5 is a side cross-sectional view of the device of FIG. 4 with a second metal layer deposited above the dielectric layer.
Figure 6:
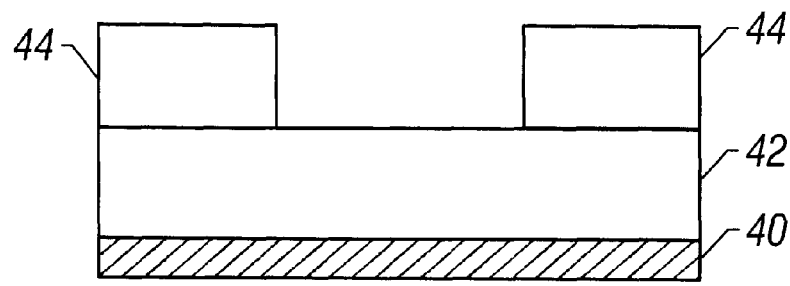
FIG. 6 is a side cross-sectional view of a dielectric layer having a photoresist mask positioned thereon.
Figure 7:
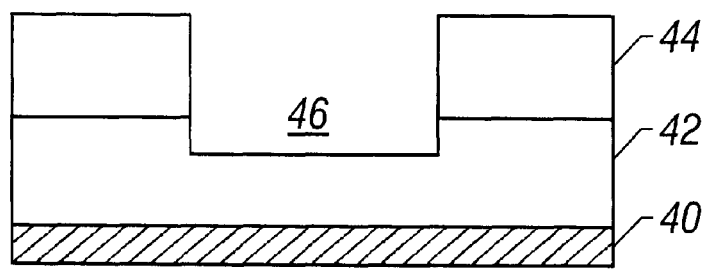
FIG. 7 is a side cross-sectional view of the dielectric layer of FIG. 6 after etching to create a cavity.
Figure 8:
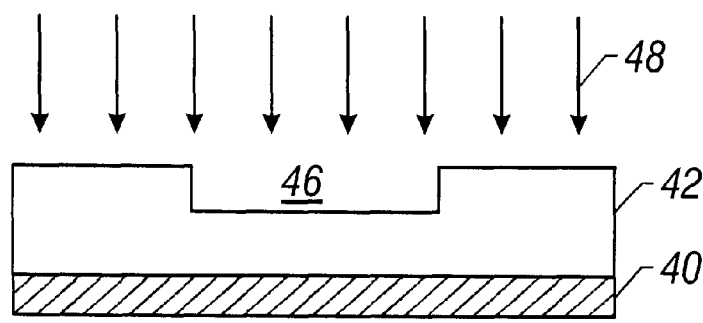
FIG. 8 is a side cross-sectional view of the device of FIG. 7 during implantation of a gaseous substance.

After the voids 26 have been formed in the ILD 22A, a second conductive layer 28 is added above the ILD 22A and a capacitor 30 may be etched and formed having a reduced dielectric constant ($\in$) (see FIG. 5). The dielectric constant ($\in$) of the ILD 22A is a function of the dielectric constant ($\in$) of the original ILD material 22 and the dielectric constant ($\in$) of the voids 26. In the above described embodiment, the dielectric constant ($\in$) of the ILD 22A having voids 26 is reduced by approximately 12% when compared to that of the original ILD 22.

Figure 9:
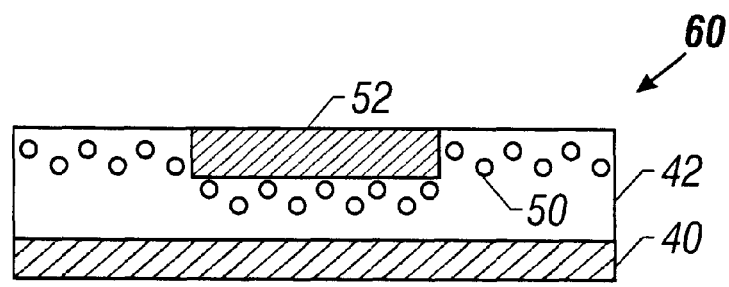
FIG. 9 is a side cross-sectional view of the device of FIG. 9 illustrating the formation of the voids in the dielectric layer after annealing and the deposition of a second conductive layer in the previously formed cavity.

A second embodiment of the present invention addresses intra-line capacitance. This embodiment utilizes the damascene process of fabrication and is illustrated in FIGS. 6–9. First, a photoresist mask 44 is applied to the ILD layer 42 residing above a first conductive layer 40 (see FIG. 6). The ILD layer 42 is then etched such that a cavity 46 is formed in the region of the ILD layer 42 left exposed by the mask 44 (see FIG. 7). After the mask 44 is removed, gaseous substances 48 are implanted into the ILD layer 42, including the cavity 46 (see FIG. 8). As illustrated in FIG. 9, the implantation results in an ILD layer 42 having voids 50 formed along the surface of the ILD layer 42, with the conductive line 52 formed within the previously etched cavity 46. In this manner, the gaseous implant may be performed after the etch to open the ILD up for subsequent metal deposition. Thus, the above described process requires no additional lithography steps over the current method of fabrication, but still results in voids formed in the dielectric layer which give the inter-level conductive system its reduced dielectric constant ($\in$).

Figure 10:
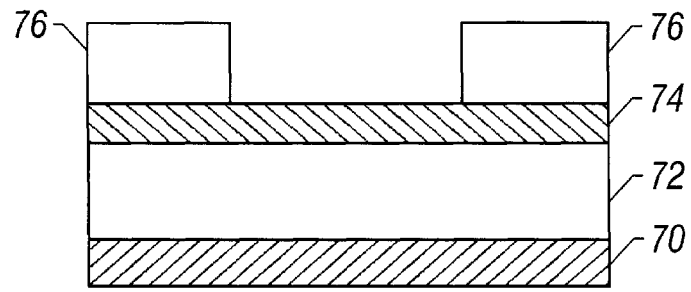
FIG. 10 is a side cross-sectional view of a device comprising a first and second conductive layer separated by a dielectric layer having a photoresist mask atop the second conductive layer.
Figure 11:
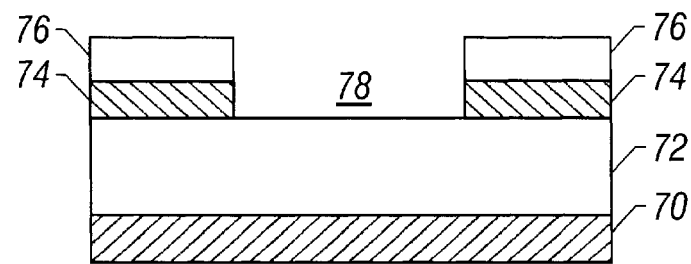
FIG. 11 is a side cross-sectional view of the device of FIG. 10 after etching of the second conductive layer to form a trench.
Figure 12:
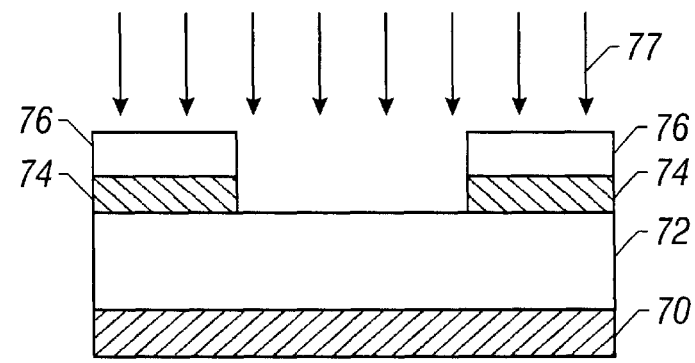
FIG. 12 is a side cross-sectional view of the device of FIG. 11 during implantation of a gaseous substance.
Figure 13:
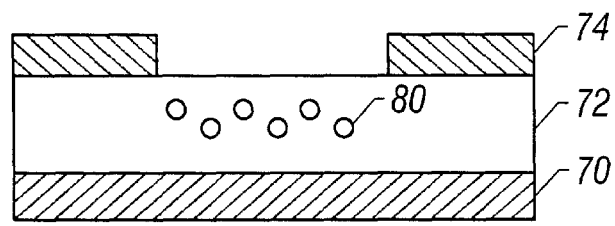
FIG. 13 is a side cross-sectional view of the device of FIG. 12 after the formation of the voids in the dielectric layer and the removal of the mask.
Figure 14:
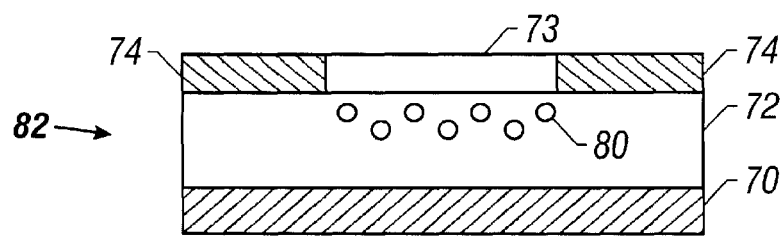
FIG. 14 is a side cross-sectional view of the device of FIG. 13 with a second dielectric layer deposited in the previously formed trench.

A third embodiment is illustrated in FIGS. 10–14. In this third embodiment, a similar process is followed for a subtractive metal approach. FIG. 10 is a side cross-sectional view illustrating a first conductive layer 70, a dielectric layer 72, a second conductive layer 74, and a photoresist mask 76 applied thereto. FIG. 11 illustrates the device of FIG. 10 after the second conductive layer 74 has been etched to form a trench 78. A gaseous substance 77 is then implanted into the device prior to the removal of the photoresist mask 76 (see FIG. 12). Next, as illustrated in FIG. 13, the photoresist mask 76 is removed. A subsequent dielectric layer 73 is then formed in the trench 78 to form the final device 82 illustrated in FIG. 14.

The above-described third embodiment fills the less critical diagonal lines and fringing capacitances. A blanket implant following the ILD deposition, either as inter-level dielectric, or intra-level dielectric, could also serve the same purpose. However, there are potential reliability problems with this alternative approach. For example, any voids in the interconnect system have the potential for weakening the interconnect ILD integrity to mechanical stress. Since the top surface of the interconnect is uncovered in this last process, however, this might allow for some relaxation of the potential stress that could result from the process.

The present invention may also be applied to an MOS transistor for reduction of the overlap capacitance. With structures having elevated source/drain structures, it is expected that the overlap capacitance will become a more substantial fraction of the transistor's capacitance than the conventional planar transistor. Consequently, the concept of a spacer having a low dielectric constant ($\in$) is of importance. An embodiment illustrating use of the present invention with an MOS transistor is depicted in FIGS. 15–18.

Figure 15:
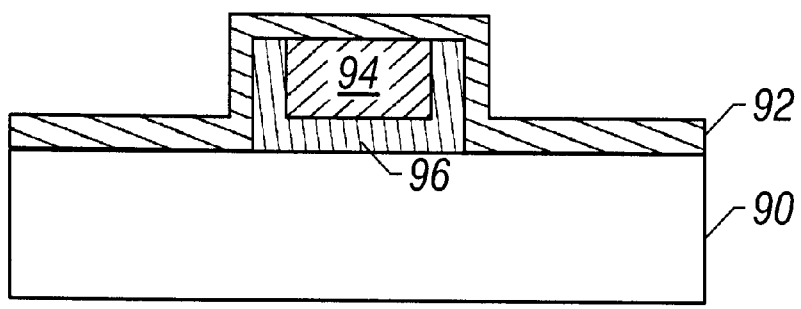
FIG. 15 is a side cross-sectional view of a gate structure having a layer of nitride deposited thereon.
Figure 16:
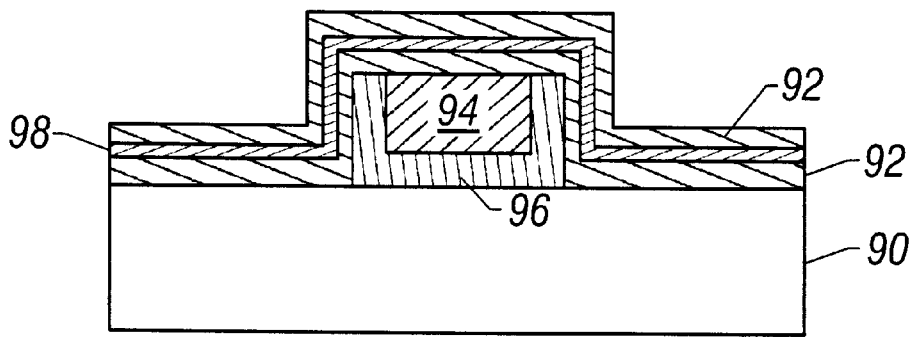
FIG. 16 is a side cross-sectional view of the device of FIG. 15 after implantation of a gaseous substance.
Figure 17:
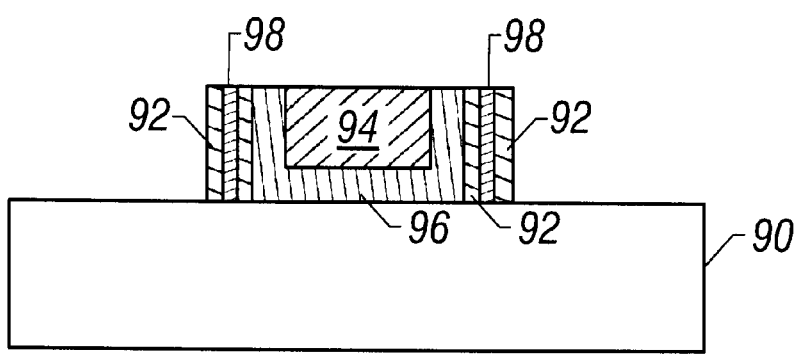
FIG. 17 is a side cross-sectional view of the device of FIG. 16 after etching of the nitride layer.
Figure 18:
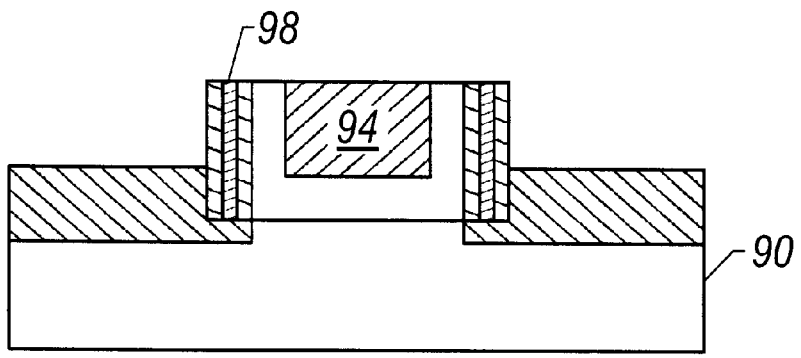
FIG. 18 is a side cross-sectional view of the device of FIG. 17 after formation of the source and drain junctions through selective epitaxy.

FIG. 15 is a side cross-sectional view of a gate structure comprising a silicon layer 90 with a polysilicon layer 94 deposited thereon and separated by an oxide layer 96. The gate structure then has a layer of nitride 92 deposited thereon. In one embodiment, the nitride layer is approximately 600–1200 Å and the oxide layer 96 is approximately 100 Å. FIG. 16 illustrates the device of FIG. 15 after the implantation of a gaseous substance such as Helium. The implantation of Helium results in the presence of a helium layer 98 caused by the implant within the nitride layer 92. Etching the nitride layer 92 (see FIG. 17) and forming the source and drain junctions through selective epitaxy (see FIG. 18) then completes the process. When comparing the device of FIG. 18 with an unimplanted device, the overlap capacitance of the transistor is reduced by approximately 25%.

Thus, by implanting voids in the dielectric layer, the dielectric constant of the dielectric layer is reduced, which in turn reduces the capacitance associated with the dielectric layer. In this manner, the global dielectric constant of an inter-metal dielectric may be decreased and consequently the speed of integrated circuits may be increased.

We claim:

1. A method comprising:

forming a dielectric layer on a first conductive layer; and implanting a substance into said dielectric layer without implanting said substance into said first conductive layer in order to decrease a dielectric constant of the dielectric layer;

wherein said implanting the substance further comprises implanting a gaseous substance into said dielectric layer, wherein said gaseous substance is selected from a group consisting of the noble gases, oxygen, and any combination thereof.

2. A method comprising:

forming a dielectric layer on a first conductive layer; and implanting a substance into said dielectric layer without implanting said substance into said first conductive layer in order to decrease a dielectric constant of the dielectric layer;

wherein implanting a substance further comprises implanting a substance at a dosage of approximately $10^{16}$ to $10^{17}$ atoms/cm$^2$.

3. A method comprising:

forming a dielectric layer on a first conductive layer;

implanting a substance into said dielectric layer without implanting said substance into said first conductive layer in order to decrease a dielectric constant of the dielectric layer; and annealing said dielectric layer at approximately 400° C. such that said implanted substance forms at least one void in said dielectric layer.

4. The method of claim 3 wherein annealing said dielectric layer further comprises annealing said dielectric layer for at least 30 seconds such that said implanted substance forms at least one void in said dielectric layer.

5. A method comprising:

forming a dielectric layer on a first conductive layer;

implanting a substance into said dielectric layer without implanting said substance into said first conductive layer in order to decrease a dielectric constant of the dielectric layer; and forming a second conductive layer adjacent said dielectric layer.

6. A method of decreasing the dielectric constant of a dielectric layer comprising:

forming a dielectric layer on a first conductive layer;

etching said dielectric layer to form a cavity;

implanting a substance into said dielectric layer; and, depositing a second conductive layer in said cavity.

7. The method of claim 6 wherein said implanting a substance further comprises implanting a gaseous substance into said dielectric layer, wherein said substance is selected from a group consisting of the noble gases, oxygen, and any combination thereof.

8. The method of claim 7 wherein said implanting a substance further comprises implanting a substance at an energy level of approximately 135 keV.

9. The method of claim 8 wherein said implanting a substance further comprises implanting a substance at a dosage of approximately $10^{16}$ to $10^{17}$ atoms/cm$^2$.

10. The method of claim 6 further comprising annealing said dielectric layer such that said implanted substance forms at least one void in said dielectric layer.

11. The method of claim 10 wherein said annealing said dielectric layer further comprises annealing said dielectric layer at approximately 400° C. such that said implanted substance forms at least one void in said dielectric layer.

12. A method of decreasing the dielectric constant of a dielectric layer, comprising:

forming a first dielectric layer on a first conductive layer;

forming a second conductive layer on said first dielectric layer;

etching said second conductive layer to form a trench, such that a portion of said first dielectric layer is exposed;

implanting a substance into said exposed portion of said first dielectric layer; and, depositing a second dielectric layer in said trench.

13. The method of claim 12 wherein said implanting a substance further comprises implanting a gaseous substance into said first dielectric layer, wherein said substance is selected from a group consisting of the noble gases, oxygen, and any combination thereof.

14. The method of claim 12 wherein said implanting a substance further comprises implanting a substance at an energy level of approximately 135 keV.

15. The method of claim 14 wherein said implanting a substance further comprises implanting a substance at a dosage of approximately $10^{16}$ to $10^{17}$ atoms/cm$^2$.

16. The method of claim 12 further comprising annealing said first dielectric layer such that said implanted substance forms at least one void in said dielectric layer.

17. The method of claim 16 wherein said annealing said first dielectric layer further comprises annealing said first dielectric layer at approximately 400° C. such that said implanted substance forms at least one void in said first dielectric layer.

18. A method of decreasing the overlap capacitance of a transistor, comprising:

forming a gate electrode;

forming a nitride layer on said gate electrode;

implanting a substance into said nitride layer;

etching said nitride layer; and, forming a source and drain junction through selective epitaxy.

19. The method of claim 18 wherein said implanting a substance further comprises implanting a gaseous substance into said first dielectric layer, wherein said gaseous substance is selected from the group consisting of the noble gases, oxygen, and any combination thereof.

20. The method of claim 18 wherein said implanting a substance further comprises implanting a substance at an energy level of approximately 135 keV.

21. The method of claim 20 wherein said implanting a substance further comprises implanting a substance at a dosage of approximately $10^{16}$ to $10^{17}$ atoms/cm$^2$.

* * * * *